United States Patent [19]

Campisi et al.

[11] Patent Number: 4,610,083

[45] Date of Patent: Sep. 9, 1986

[54] METHOD AND APPARATUS FOR ELECTRONIC COMPONENT MATCHING

[75] Inventors: Carl Campisi; David C. Kilinskis, both of Chicago; Peter C. Skerlos, Arlington Heights; Egil Sorlie, Roselle, all of Ill.

[73] Assignee: Zenith Electronics Corporation, Glenview, Ill.

[21] Appl. No.: 769,822

[22] Filed: Aug. 26, 1985

[51] Int. Cl.⁴ .................... H05K 3/30; B23P 19/00
[52] U.S. Cl. ........................... 29/832; 29/740; 156/344; 227/1; 227/6; 414/225
[58] Field of Search .............. 29/832, 740, 741; 53/591; 156/344; 414/223, 225; 227/1, 6

[56] References Cited

U.S. PATENT DOCUMENTS

| | | | |
|---|---|---|---|
| 4,069,931 | 1/1978 | Saylors | 156/344 X |
| 4,253,906 | 3/1981 | Boogers | 156/344 X |
| 4,274,196 | 6/1981 | Lemmer | 29/741 |
| 4,307,832 | 12/1981 | Taki et al. | 29/740 X |
| 4,327,482 | 5/1982 | Araki et al. | 29/740 |
| 4,472,218 | 9/1984 | Avedissian et al. | 156/64 |
| 4,476,626 | 10/1984 | Gumbert et al. | 29/740 |

Primary Examiner—Howard N. Goldberg
Assistant Examiner—Carl J. Arbes

[57] ABSTRACT

An electronic component matching system operates in conjunction with a component transport arrangement wherein a component-carrying supply tape from which components are removed for positioning upon a circuit board in a matched manner is linearly displaced. The components are thus sequentially moved to a pick-up point whereupon a predetermined number N of components having similar operating characteristics are incorporated in the same circuit. As the component-carrying supply tape is displaced toward the component pick-up point, an electro-optical sensor detects the presence or absence of components on the supply tape and provides this information to a microcomputer controller. The stationary sensor is positioned in spaced relation from the pick-up point along the component-carrying supply tape displacement path to allow for the detection of the predetermined number of components between the sensor and the pick-up point to ensure that a matched set of N components is available on the tape for incorporation in the same circuit. If the sensor determines that less than N components are present between the sensor and the pick-up point, the microcomputer advances the supply tape to the next group of matched components to prevent components from different matched groups having different operating characteristics from being incorporated in the same circuit. This system is particularly adapted for the automatic positioning of components such as transistors and diodes having matched operating characteristics for incorporation in the same circuit.

19 Claims, 4 Drawing Figures

0
METHOD AND APPARATUS FOR ELECTRONIC COMPONENT MATCHING

BACKGROUND OF THE INVENTION

This invention relates generally to the automatic feeding of electronic components for positioning in a circuit and is particularly directed to the automatic grouping of common electronic components having similar operating characteristics for incorporation in the same circuit in a matched manner.

Individual electronic components are typically positioned and connected in circuit by means of high speed automatic component handling arrangements for more reliable and less expensive electronic circuit fabrication. Component handling arrangements typically include a hopper containing a large number of the same kind of electronic components which are displaced by gravity to an aperture in a lower portion of the hopper for deposit upon either a fixed or a moving component positioning mechanism, whereupon the deposited component is engaged and displaced by a movable robotic gripper assembly for positioning upon a circuit board. In a moving component positioning mechanism the electronic components are typically deposited upon a flexible, tape-like strip in a spaced manner. As the component-carrying strip is unwound from a supply reel, the electronic components are sequentially positioned for grasping by a component engagement and positioning mechanism which positions each component in a given orientation and at a predetermined location on the circuit board. Following removal of a component from the tape-like strip, the strip is wound unto a take-up reel for re-use following the positioning of another set of components thereon.

The length of these component-bearing strips is typically such that a single strip may provide for the transport of several thousand electronic components. All components on a given strip are generally of the same type, i.e., resistors, capacitors, diodes, transistors, etc., with the components on a given strip grouped in accordance with their operating characteristics for certain applications. For example, the specification of a circuit being fabricated may call for the tolerance of a given electronic component used therein to fall within a range of 10±15 representing the allowable range of a given operating parameter of the component. Following manufacture of these components, they are tested and grouped when positioned upon the strip in accordance with the value of this operating parameter as measured during component testing. Thus, those components exhibiting an operating characteristic outside of the aforementioned tolerance range are rejected, while those components having a reading of 6 are grouped together, those components having a reading of 7 are grouped together, and so forth.

In many applications it is not only desirable, but absolutely essential to incorporate identical components having similar operating characteristics in the same circuit. This is commonly referred to as "matching" electronic components in a given circuit to ensure optimum circuit performance. For example, this matching procedure is used in the fabrication of tunable circuits such as used in RF receivers which typically incorporate more than one tuning voltage-responsive component for adjusting the resonant frequency of various stages in the tunable circuit to a desired RF frequency. Generally, the same tuning voltage is applied to each of these tuning voltage-responsive components, such as varactor diodes, in the various stages and it is essential for proper tuning of the circuit that all of these components respond substantially identically to changes in the tuning voltage. Transistors also are frequently used in a matched manner in the same circuit and should ideally exhibit an essentially identical response to a common input control signal.

The present invention provides an arrangement for ensuring that components of the same type grouped in accordance with a given operating characteristic are automatically provided in a matched manner for installation in an electronic circuit. Where the electronic components are provided by means of a moving component supply tape to automatic component engaging and positioning apparatus, the present invention ensures that only those components having common operating characteristics and which are grouped in accordance therewith are incorporated in the same circuit.

OBJECTS OF THE INVENTION

Accordingly, it is an object of the present invention to provide an improved arrangement for the automatic positioning of electronic components on a circuit board.

It is another object of the present invention to provide for the automatic feeding of matched groups of electronic components for incorporation in a circuit.

Yet another object of the present invention is to provide for the automatic grouping of the same type of electronic components having common operating characteristics in a continuous feed arrangement for installation on a circuit board.

Still another object of the present invention is to provide an improved arrangement for the grouping of matched electronic components prior to their incorporation in a circuit.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION OF THE PREFERRED EMBODIMENT

Figure 1:
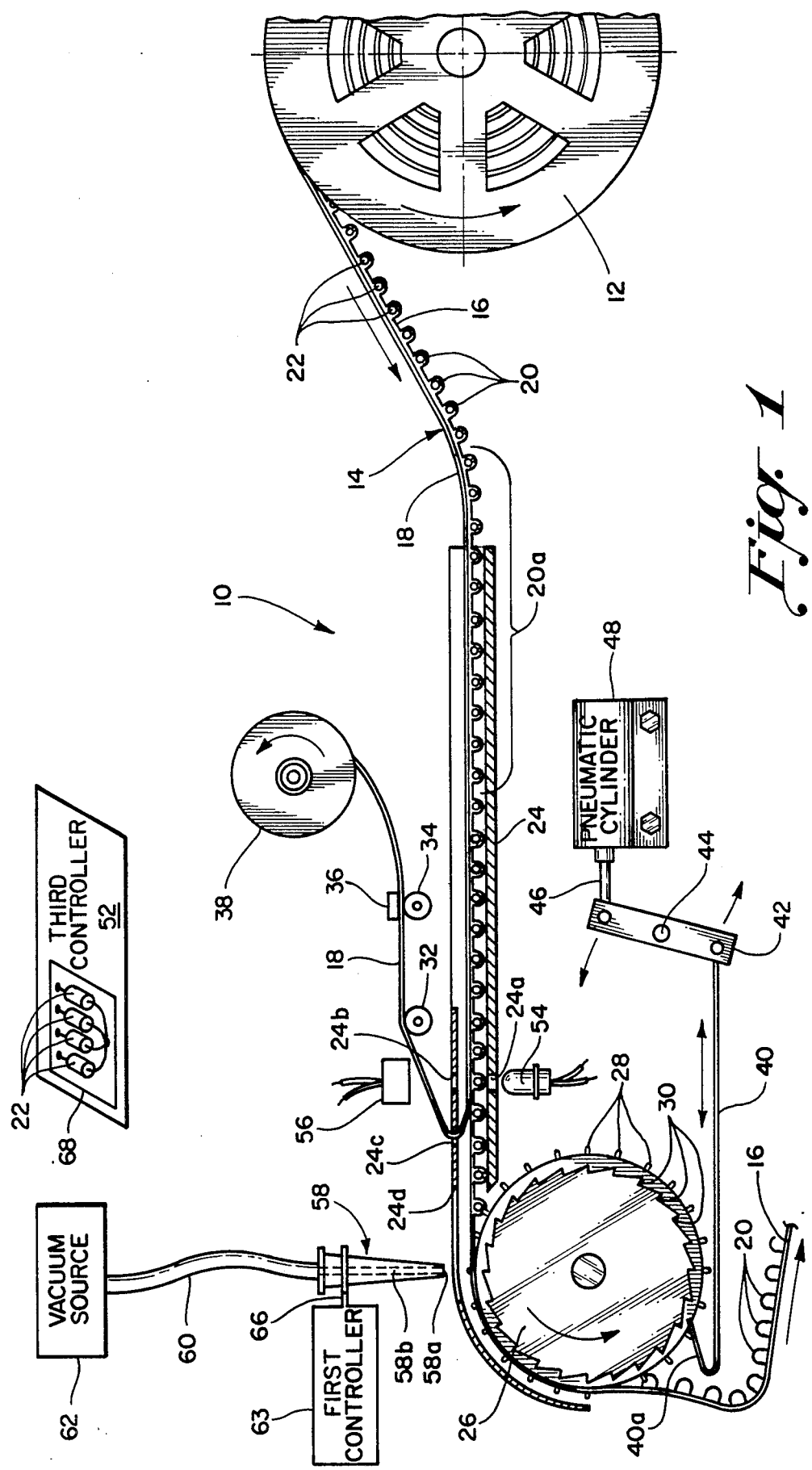
FIG. 1 is a simplified schematic diagram of an electronic component matching system in accordance with the present invention.

Referring to FIG. 1, there is shown in simplified schematic diagram form an electronic component matching system 10 in accordance with the principles of the present invention.

Figure 2:
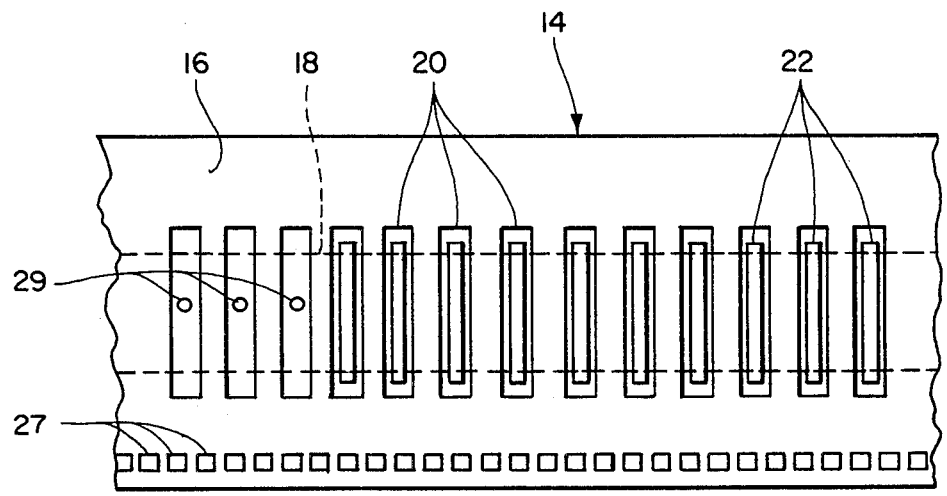
FIG. 2 is a plan view of a component supply tape with a plurality of electronic components positioned thereon for use with the electronic component matching system of the present invention.

The electronic component matching system 10 includes a component delivery arrangement wherein a component transport structure 14 positioned upon a rotating supply reel 12 is linearly displaced by means of a drive wheel 26 in the direction of the arrows in the figure for removal of electronic components 22 from the component transport structure by means of a pick-up arm 58 which deposits the thus removed electronic components upon a printed circuit board 68. The component transport structure 14, a plan view of which is illustrated in FIG. 2, includes an opaque supply tape 16 and a transparent tape backing 18. The tape backing 18 is securely affixed to one surface of the supply tape 16 along the length thereof by means of an appropriate adhesive applied to the tape backing. The supply tape 16 includes a plurality of notches or indentations 20 along the length thereof, with an electronic component 22 positioned within each of the aforementioned notches by means of conventional electronic component handling apparatus (not shown) which does not form a part of the present invention and thus is not further discussed herein. With the notches 20 extending from one side of the supply tape 16, the transparent tape backing 18, which is shown in dotted line form in FIG. 2, is positioned on the other side of the supply tape over the linear array of notches 20 therein in order to maintain the electronic components 22 on the supply tape.

All of the electronic components positioned on a given supply tape are typically of the same type, e.g., resistors, transistors, diodes, capacitors, etc., and are further ordered in separate groups on the supply tape in accordance with the value of a given operating parameter or parameters of the components. For example, while electronic components exhibiting a range of a given operating parameter may be installed in the circuit being fabricated, the components positioned upon the component transport structure 14 are frequently grouped in accordance with values of that operating parameter extending over the permissible range of values. Thus, all components exhibiting an operating parameter value of X are grouped together, while all components exhibiting an operating parameter value of Y are segregated in a second group of components, and so forth depending upon the allowable range of the operating parameter. The various groups of electronic components are typically separated by a plurality of empty notches 20 in the supply tape 16 which provides an indication of the transition from a first group of electronic components exhibiting a first operating parameter value to a second group of electronic components exhibiting a second operating parameter value. This is shown in FIG. 1, wherein a plurality of empty notches 20a are shown separating a first group of electronic components to the left thereof from a second group of electronic components to the right thereof.

An optical sensing arrangement described in detail below is used for detecting the presence of an electronic component 22 within one of the notches 20 in the supply tape 16. Each of the notches 20 in the supply tape 16 is provided with an aperture 29 therein. Thus, with the supply tape 16 comprised of an opaque material, light will be transmitted through an aperture 29 in one of the notches 20 only if an electronic component 22 is not positioned within that notch. Also provided along one edge of the supply tape 16 are a plurality of spaced, linearly aligned drive apertures 27. The drive apertures 26 are adapted for engagement by a plurality of teeth in a drive wheel as described in detail below for transporting the component transport structure 14 as it is removed from the supply reel 12, displaced to a component pick-up point, and positioned upon a take-up reel (not shown).

As shown in FIG. 1, a drive wheel 26 having a plurality of outer teeth 28 around the periphery thereof is positioned in spaced relation from the supply reel 12 and is adapted to engage the drive apertures 27 in the supply tape 16 for displacing the component transport structure 14 in the direction of the arrows in the figure. Positioned adjacent to the drive wheel 26 and extending toward the supply reel 12 is an elongated, curvilinear alignment/support bracket 24 which ensures proper positioning of the component transport structure 14 relative to other system components as it is displaced from the supply reel 12 to the drive wheel 26. As shown in FIG. 1, a lower portion of the alignment/support bracket 24 provides support for the electronic components 22 positioned within the respective notches 20 in the supply tape 16. Also positioned in a lower portion of the alignment/support bracket 24 is a lower aperture 24a. Positioned in an upper portion of the alignment/support bracket 24 and in generally vertical alignment with the lower aperture 24a therein is a first upper aperture 24b. Positioned in vertical alignment with the aforementioned lower and upper apertures 24a, 24b and immediately below and above the alignment/support bracket 24 is an optical detection system comprised of an infrared (IR) light emitting diode (LED) 54 and an IR photodetector 56. The IR LED 54 projects an infrared beam upward through the lower aperture 24a in the alignment/support bracket 24. The IR beam is not transmitted to the IR photodetector 56 because the supply tape 16 is comprised of an opaque material and is not transparent to the IR light. However, passage of an empty notch 20 wherein an electronic component 22 is not positioned allows the IR beam to be transmitted from the IR LED 54 via the detection aperture 29 within the notch to the IR photodetector 56. It is in this manner that the electronic component matching system 10 detects the presence or the absence of an electronic component in one of the notches 20 in the supply tape 16.

As shown in FIG. 1, the tape backing 18 is in position upon the supply tape 16 where the IR beam is incident upon the component transport structure 14 and, since it is optically transparent, the tape backing permits the IR beam to transit the lower and upper apertures 24a, 25b in the alignment/support bracket 24 and to be incident upon the IR photodetector 56. The tape backing 18 is directed through a second upper aperture 24c within the alignment/support bracket 24 and is guided by the combination of first and second rollers 32, 34 and an alignment bracket 36 to an uptake reel 38. It is in this manner that the tape backing 18 is removed from the supply tape 16 to allow the electronic components 22 positioned within the notches 20 thereof to be removed therefrom.

As the supply tape 16 is displaced leftward in FIG. 1, the components positioned in the notches 20 thereof become aligned with and are positioned immediately below an upper slot 24d in an upper portion of the alignment/support bracket 22. Positioned immediately above the upper slot 24d is pick-up arm 58 which includes a slot 58b extending the length thereof. An upper end of the pick-up arm 58 is coupled by means of a flexible hose 60 to a vacuum source 62 for evacuating the slot 58b within the pick-up arm to allow the electronic components 22 in the supply tape 16 to be engaged by the pick-up arm at a distal aperture 58a therein for removing the components from the supply tape. The components thus removed from the supply tape 16 are maintained in contact with the distal end of the pick-up arm 58 by means of the vacuum produced therein by the aforementioned vacuum source 62.

Also coupled to the pick-up arm 58 by means of a control arm 66 is a first controller 63. The first controller 63 may be conventional in design and operation and is typically controlled by a microcomputer (not shown) for displacing the pick-up arm 58 vertically in engaging and removing electronic components 22 from the supply tape 16. Further movement of the pick-up arm 58 under the control of the first controller 63 provides for positioning of the electronic components upon a printed circuit board 68 for fabricating a circuit thereon. As shown in FIG. 1, various components 22a have been positioned upon the circuit board 68 by means of the pick-up arm 58 and have been coupled in circuit thereon. Since the first controller 63 does not form a part of the present invention it is not further discussed herein.

The drive wheel 26 includes a plurality of outer teeth 28 positioned around the periphery thereof. The outer teeth 28 are adapted for positioning within respective drive apertures 27 located along an edge of the supply tape 16 for engaging and transporting the supply tape from the supply reel 12 to an uptake reel (not shown). By rotating the drive wheel 26 in the direction of the arrow shown thereon, the component transport structure 14 including the supply tape 16 will be displaced leftward in FIG. 1 as shown by the arrows therein.

The drive wheel 26 further includes a plurality of inner teeth 30 in the general form of a ratchet wheel positioned on one end of the drive wheel. The inner teeth 30 are adapted for engagement by the hooked distal end 40a of a control arm 40. A proximal end of the control arm 40 is coupled to a first end of a pivot arm 42 which is coupled to and adapted for pivoting about a pivot pin 44. A second end of the pivot arm 42 is coupled to a piston arm or rod 46 of a double-acting pneumatic cylinder 48. In response to extension and retraction of the piston arm 46 following actuation by the double-acting pneumatic cylinder 48, the pivot arm 42 is respectively rotated counterclockwise and clockwise. Counterclockwise rotation of the pivot arm 42 displaces the control arm 40 rightward causing the hooked distal end 40a thereof to engage one of the inner teeth 30 on the end of the drive wheel 26 which, in turn, is rotated in a counterclockwise direction as shown by the arrow thereon. Following extension of the piston arm 46 by the pneumatic cylinder 48 and the resulting counterclockwise rotation of the drive wheel 26, the piston arm is then retracted by the pneumatic cylinder resulting in the leftward displacement of the control arm 40 which is then positioned for engagement with the next successive inner tooth on the end of the drive wheel 26. It is in this manner that the reciprocating displacement of the piston arm 46 and the control arm 40 causes the counterclockwise rotation of the drive wheel 26 and the displacement of the component transport structure 14 positioned thereon. The hooked distal end 40a of the control arm 40 is adapted for engaging and rotating the drive wheel 26 when displaced rightwardly, while allowing the control arm 40 to be displaced leftwardly in an unhindered manner so as to reposition the hooked distal end thereof for subsequent engagement of the next successive inner tooth 30. The controlled manner in which the drive wheel 26 is rotationally displaced in response to the extension of the piston arm 46 of the pneumatic cylinder 48 is described in detail in the following paragraphs.

Figure 3:
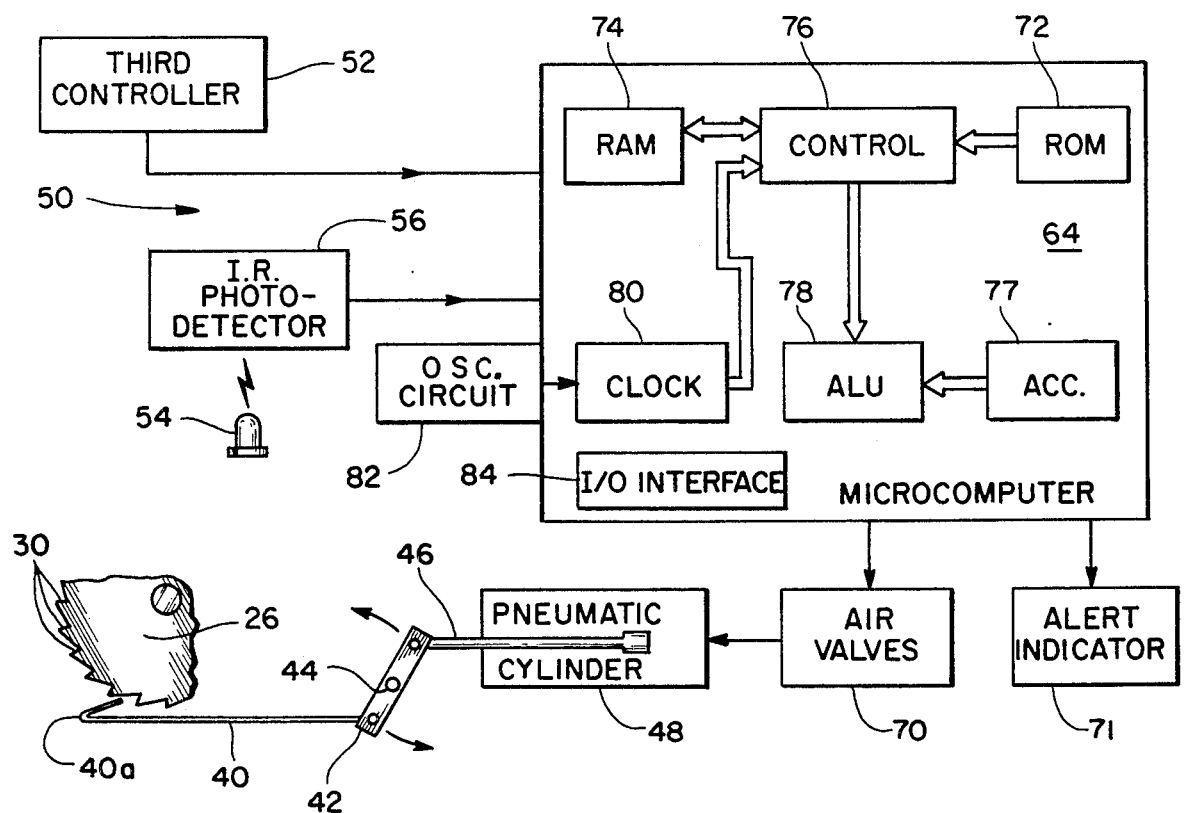
FIG. 3 is a simplified schematic diagram of the control portion of the electronic component matching system of FIG. 1.

Referring to FIG. 3, there is shown a simplified schematic and block diagram of a control system 50 for use in the electronic matching system 10 of the present invention. The control system 50 includes the aforementioned combination of the IR LED 54, the IR photodetector 56, the pneumatic cylinder 48, the pivot arm 42, and the control arm 40. The control system 50 further includes a microcomputer controller 64 coupled to the IR photodetector 56 and responsive to control signals received therefrom. The control system further includes a plurality of air valves 70 coupled to the pneumatic cylinder 48 and to the microcomputer controller 64 and responsive to control inputs provided therefrom for either extending or retracting the piston arm 46 of the pneumatic cylinder 48. The operation of the microcomputer controller 64, or simply the microcomputer as it is subsequently referred to, is described in detail in the following paragraphs.

The microcomputer 64, which is a Z-100 microcomputer available from Zenith Data Systems in a preferred embodiment, is responsive to an output signal from the IR photodetector 56 when an IR signal is received from the IR LED 54. Receipt of an IR signal from the IR LED 54 by the IR photodector 56 indicates that a notch 20 in the supply tape 16 positioned between the IR LED and the IR photodetector is empty and does not contain an electronic component.

In addition, a third controller 52 is provided for positioning of the circuit board 68 in a desired location relative to the pick-up arm 58 to facilitate the positioning of electronic components upon the circuit board. In general, the third controller 52, which is shown in FIG. 1 merely as a block upon which the printed circuit board 68 is positioned and by means of which the circuit board may be displaced, may be conventional in design and operation and operates to sequentially position each circuit board for the placement of electronic components 22a thereon by means of the pick-up arm 58. As such, the third controller 52 may be in the form of a horizontally displaced conveyor arrangement or a vertical positioning system whereby each circuit board is sequentially positioned adjacent to the pick-up arm 58. Control mechanisms such as the third controller 52 typically include various sensors for providing various output signals to other components of the circuit board positioning and assembly arrangement. For example, the third controller 52 provides an output signal indicating the removal of a first printed circuit board upon which electronic components have been positioned from immediately adjacent to the pick-up arm 58 and the positioning of a second printed circuit board in this location for the incorporation of various electronic components thereon. Such output signals from the third circuit board positioning controller 52 are conventional and well known in the art, with the generation thereof not forming a part of the present invention. In the present invention, a signal representing the removal of a first circuit board and its replacement by a second circuit board is provided to the microcomputer 64 for use therein as described in the following paragraphs.

The microcomputer 64, having the internal configuration of a conventional microcomputer, includes a ROM 72, a RAM 74, a controller 76, an accumulator 77, an ALU 78, a clock 80, and an input/output (I/O) interface 84 including a plurality of input and output lines as well as other standard components. The microcomputer 64 stores instructions and data, periodically updates the stored data, compares both stored and real-time data, and makes decisions based upon these comparisons by means of logic instructions in providing control for the electronic component matching system 10. The ROM 72 is a mask-generated, nonvolatile, factory produced memory matrix which includes a plurality of memory locations or "bytes" of eight bits each. Programs and instruction data are stored in ROM 72. Hexadecimal notation is used by the ROM from which instructions and data are sequentially removed by the controller 76 in carrying out program functions.

Various operating data is stored in the RAM 74 which is a volatile memory. Upon actuation of the microcomputer 64, the operating program stored in the ROM 72 initializes the RAM data from the ROM which causes the binary signals representing the first instruction stored in the ROM 72 to be provided to the microcomputer controller 76 and causes various other portions of the microcomputer 64 to be initialized for proper future operation. An arithmetic and logic unit (ALU) 78 receives binary control signals from the controller 76 and performs the required arithmetic or logic operation.

Timing for the microcomputer 64 is provided by means of an oscillator circuit 82 on the microcomputer which generates the clock signal necessary to perform a given operation. The microcomputer's clock generator 80 is driven by the oscillator circuit 82. In response to the various instructions executed by the microcomputer 64 on the control inputs received from the IR photodetector 56 and the third controller 52, the microcomputer provides control signals to the plurality of air valves 70 for controlling operation of the pneumatic cylinder 48 and to an alert indicator 71 for alerting a system operator to a malfunction in the operation of the electronic component matching system 10 as described below.

Figure 4:
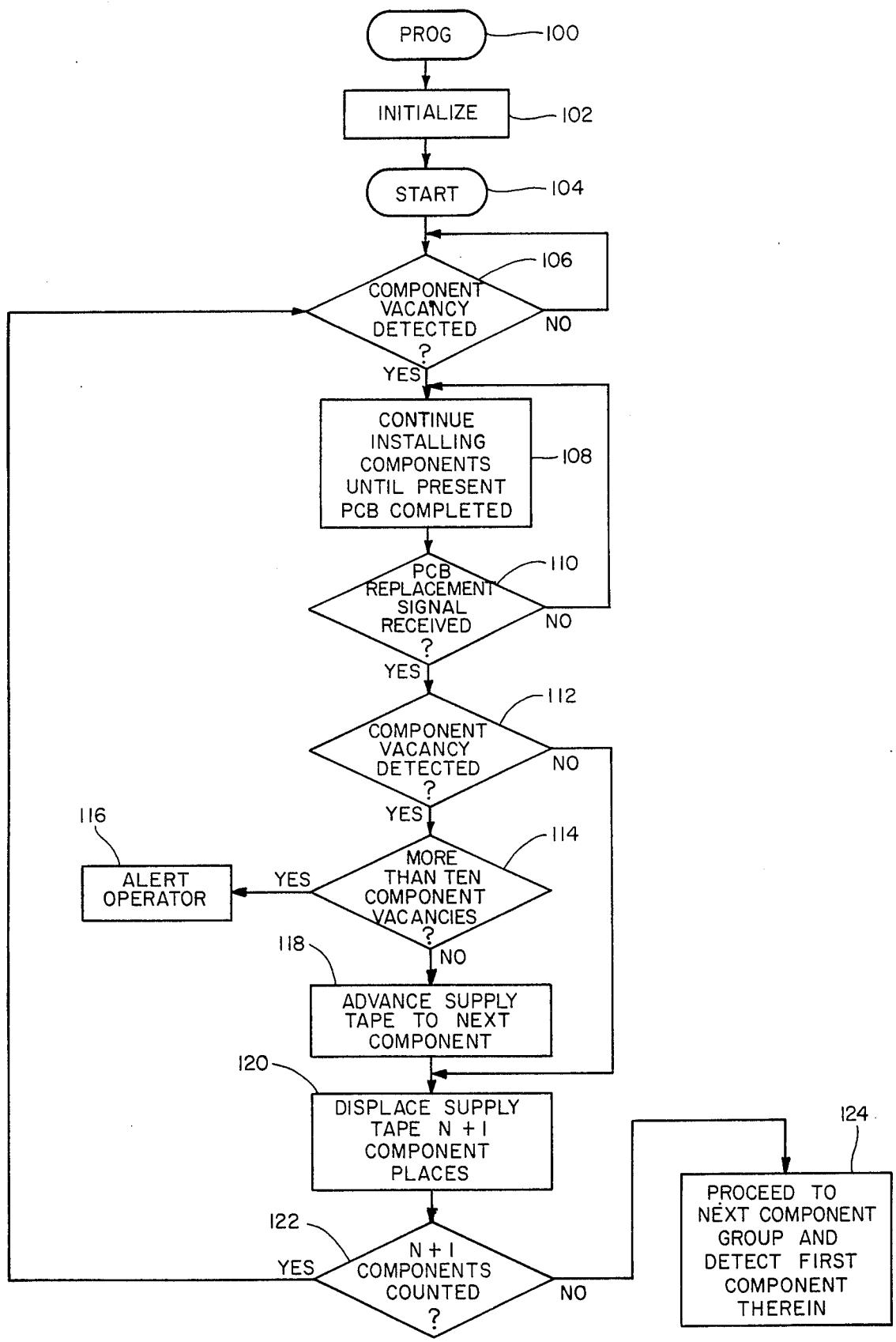
FIG. 4 is a flow chart illustrating the sequence of operations carried out in the electronic component matching system of the present invention under the control of a microcomputer controller.

Referring to FIG. 4, there is shown a simplified flow chart illustrating the operations carried out by the microcomputer 64 in exercising control over the electronic component matching system 10 in accordance with the present invention. In referring to FIG. 4, an oval symbol indicates the start of an operational sequence, a rectangle indicates an instruction or set of instructions resulting in the performance of a control function, and a diamond indicates a decision point based upon the comparison of binary signals either input to the microcomputer 64 or stored therein.

In block 100 the program for detecting the presence of electronic components 22 positioned upon the supply tape 16 along the length thereof and for controlling the supply tape drive mechanism which includes the air valves 70, the pneumatic cylinder 48, the control arm 40, and the drive wheel 26 is initiated. In block 102 the microcomputer 64 is initialized and 0's are stored in all memory locations within the RAM 74. Each of these memory locations corresponds to a given notch 20 in the supply tape 16. Thus, as the drive wheel 26 is rotated in a step-wise manner for incrementally displacing the supply tape 16, the operating program stored in the microcomputer's ROM 72 sequences through the data storage locations in the RAM 74. In response to the absence of an IR beam received by the IR photodetector 56 indicating the presence of an electronic component 22 in the notch 20 positioned between the IR LED 54 and the photodetector, the contents of that particular RAM location remain unchanged with a "0" stored therein. In response to receipt of the IR photodetector 56 of the IR beam from the IR LED 54 indicating the absence of an electronic component in a supply tape notch, the microcomputer controller 76 under the control of the operating program stored in the ROM 72 loads a "1" in that particular RAM location. A start loop to detect the presence or absence of electronic components in each of the notches 20 of the supply tape 16 as they are sequentially positioned between the IR LED 54 and the IR photodetector 56 is initiated at block 104.

At step 106, the program stored in the microcomputer's ROM 72 looks for receipt of an input from the IR photodetector 56 as an indication that a notch in the supply tape 16 does not contain an electronic component. If a component vacancy is not detected at step 106 indicating that the notch in the supply tape 16 positioned between the IR LED and photodetector contains an electronic component, the program executes a loop and continues to search for a vacant notch along the length of the supply tape. In one embodiment of the present invention, four components from a single group of electronic components positioned upon the supply tape 16 are positioned in the same circuit. However, the present invention is not limited to the placing of this number of components in a given circuit and thus the number of components matched by means of the present invention for incorporation in the same electronic circuit is herein designated as the number N, where N can assume virtually any positive integral value greater than 1. In addition, it must be pointed out that in order to carry out the present invention, the number of notches 20 positioned between the combination of the IR LED 54 and the IR photodetector 56 along the length of the supply tape 16 and the pick-up point where electronic components 22 are removed from the supply tape by the pick-up arm 58 must be equal to or greater than N. In a preferred embodiment, in order to take into account components which are inadvertently dropped by the pick-up arm 58 following removal from the supply tape 16, the number of notches 20 positioned between the IR LED and photodetector combination and the pick-up arm 58 is set at N+1. The present invention is particularly adapted for the positioning of four varactor diodes in the same tunable circuit on the printed circuit board 68 for use in the tuner of a television receiver. However, various other components such as transistors may similarly be placed in circuit in a matched arrangement in various other circuit arrangements in accordance with the present invention.

If at step 106, an input signal is received by the microcomputer 64 from the IR photodetector 56 indicating the absence of an electronic component in a given notch 20 in the supply tape 16, the program proceeds to step 108 and continues providing displacement commands to the air valves 70 for incrementally displacing the component transport structure 14 in a step-wise manner. This operation continues at step 108 until all of the remaining components have been positioned upon the printed circuit board 68 by the pick-up arm 58. Thus, if one component has been already positioned upon the printed circuit board and a vacant notch in the supply take 16 is detected, the microcomputer 64 will provide N−1 additional displacement commands to the air valves 70 for displacing the supply tape N−1 times.

Following the completion of the insertion of N components upon a circuit board, the third controller 52, which sequentially positions each circuit board in the proper location for insertion of electronic components thereon by the pick-up arm 58 and detects the insertion of these components on the circuit board, provides a circuit board replacement signal to the microcomputer 64. Following installation of N electronic components upon the circuit board 68 at step 108, the program stored in the microcomputer's ROM 72 then proceeds to step 110 and monitors for the receipt of a circuit board replacement signal from the third controller 52 indicating that the completed circuit board has been removed by the third controller and the next circuit board is in position for the installation of electronic components thereon. If the circuit board replacement signal is not yet received at step 110, the program branches back to step 108 and microcomputer 64 continues issuing step-wise displacement command signals to the air valves 70 for incrementally displacing the supply tape 16 to allow for removal of electronic components therefrom by the pick-up arm 58.

Following receipt of a circuit board replacement signal from the third controller 52 by the microcomputer 64, the program at step 112 then determines if the supply tape notch 30 positioned between the IR LED and photodetector contains an electronic component. If a signal is received from the IR photodetector 56 indicating that the supply tape notch positioned between the IR LED and photodetector is empty, the program proceeds to step 114 and begins counting the number of consecutive vacant notches in the supply tape 16. This counting procedure is accomplished by means of a software counter in the program stored in the microcomputer's ROM 72. If more than a predetermined number of consecutive vacancies, in the present case this number equals 10, are counted in the supply tape 16 at step 114, the program at step 116 provides an alert signal to an alert indicator 71 coupled to the microcomputer 64. The alert indicator may be visual such as an LED or may be an audio alarm or other conventional means for alerting an operator to the improper operation of the component feed assembly. Actuation of the alert indicator 71 may arise from such conditions as a jamming of the supply tape 16 whereupon its continued linear displacement is prevented or when the remainder of the supply tape is empty and contains no additonal electronic components giving rise to the requirement to replace the supply reel with another reel containing an electronic component-laden supply tape. In either case, corrective action by the operator is required and is initiated by actuation of the alert indicator 71 by the microcomputer 64.

If ten or less component vacancies in the supply tape 16 are counted at step 114, the program branches to step 118 and executes a step-wise advance to the next notch in the supply tape containing an electronic component. The program then causes the microcomputer 64 to provide N+1 step-wise displacement commands to the air valves 70 at step 120. This ensures that the required number of electronic components, i.e., N, are positioned between the IR LED and photodetector and the pick-up arm 58 and are available for positioning upon the circuit board 68. Similarly, if at step 112 a component vacancy in the supply tape 16 is not detected, the program branches down to step 120 for displacing the supply tape N+1 component places in order to ensure that the proper number of components are available and in position for insertion upon a given circuit board.

During the rapid displacement of the supply tape 16 at step 120 wherein the supply tape is advanced N+1 spaces, the third controller 52 moves the next circuit board 68 in position adjacent to the pick-up arm 58 and the pick-up arm is prevented from engaging any electronic component which may be displaced adjacent to it. After N+1 components are counted following the providing of N+1 tape drive signals by the microcomputer 64 to the air valves 70 in the absence of receipt of a signal by the microcomputer from the IR photodetector 56 at step 122, the program branches back to step 106 and monitors the input line from the IR photodetector to the microcomputer in order to detect the next vacant notch. Following detection of the next vacant notch, the program proceeds as shown in FIG. 4 to control the displacement of the supply tape 16 in ensuring that the required number of electronic components for placement upon the next circuit board are positioned between the IR LED and photodetector and the pick-up arm. If at step 122, N+1 electronic components have not been counted, the microcomputer 64 provides appropriate control signals to the air valves 70 for rapidly advancing the supply tape 16 to the next component group positioned thereon and awaits receipt from the IR photodetector 56 indicating the presence of the first component in the aforementioned second component group at step 124.

There has thus been shown an electronic component matching arrangement for automatically positioning a given number of identical electronic components upon a printed circuit board in a matched arrangement. The electronic component matching system ensures that the required number of components are available on a linearly displaced supply tape for automatic insertion upon the circuit board and automatically advances to the next group of components when less than the number of required components is available to ensure that only matched components are incorporated on the same circuit board. The present invention is particularly adapted for the insertion of matched tunable circuit components in a common RF tuning circuit.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. In the automatic feeding of electronic components of a single type positioned in spaced relation upon a moving component supply tape for sequential deposit upon a circuit board, wherein said electronic components are arranged along said supply tape in first and second groups in accordance with an operating characteristic thereof and wherein said first and second groups are separated by a gap in the components positioned on the supply tape, a system for positioning N electronic components from said first group on a circuit board in an electrically matched arrangement, where N is a positive integer greater than 1, said system comprising:

drive means coupled to said supply tape for linearly displacing in a step-wise manner the supply tape and the electronic components positioned thereon to a pick-up point;

movable engaging means positioned at said pick-up point for engaging and removing an electronic component from the supply tape positioned at said pick-up point and for positioning the electronic component upon the circuit board;

detection means positioned adjacent to the supply tape in spaced relation from said pick-up point in a direction therefrom opposite to the direction of displacement of said supply tape for detecting the absence of an electronic component upon the supply tape and for generating a first detection signal in response thereto; and first control means coupled to said drive means and to said detection means and responsive to receipt of said first detection signal for sequentially displacing N components from said first group to said pick-up point or for rapidly advancing the supply tape to the second group if there are less than N components remaining in the first group in preventing the positioning of electronic components from the first and second groups upon the same circuit board.

2. The system of claim 1 wherein the component supply tape includes a first plurality of notches containing electronic components of the first group, a second plurality of notches containing electronic components of the second group, and a third plurality of empty notches positioned between the first and second electronic component groups.

3. The system of claim 2 further including a tape backing affixed to one side of the component supply tape so as to cover the notches therein in maintaining the components in position therein and further including removal means for removing the tape backing from a portion of the component supply tape before that portion of the component supply tape is positioned at the pick-up point.

4. The system of claim 3 wherein each notch includes an aperture therein and said detection means includes a light sensor arrangement for directing and detecting a light beam through an aperture in a notch for detecting the absence of an electronic component therein.

5. The system of claim 4 wherein said light sensor arrangement includes in combination a light emitting diode positioned on a first side of the component supply tape for directing an IR beam thereon and a photodetector positioned upon a second, opposite side of the component supply tape for detecting the IR beam transmitted through an aperture in a notch in detecting the absence of an electronic component in that notch.

6. The system of claim 1 further including a second control means coupled to said movable engaging means for displacing said engaging means and an electronic component engaged thereby between the pick-up point and the circuit board.

7. The system of claim 1 wherein said movable engaging means includes a pick-up arm and a vacuum source coupled thereto and wherein the electronic components are drawn under vacuum in secure engagement with said pick-up arm.

8. The system of claim 1 wherein said drive means includes in combination a rotating drive wheel coupled to the supply tape and pneumatic drive means coupled to said drive wheel and to said first control means for incrementally displacing said rotating drive wheel in sequentially positioning the electronic components at said pick-up point.

9. The system of claim 8 wherein said pneumatic drive means includes in combination a plurality of air valves coupled to said first control means, a control arm coupled to said rotating drive wheel, and a pneumatic cylinder coupled to said air valves and to said control arm.

10. The system of claim 1 wherein at least N electronic components are positioned upon the component supply tape between said detection means and said pick-up point.

11. The system of claim 10 wherein $N+1$ electronic components are positioned upon the component supply tape between said detection means and said pick-up point.

12. The system of claim 10 wherein said first control means includes counting means for counting the number of electronic components positioned upon the supply tape between said detection means and said pick-up point.

13. The system of claim 12 wherein said counting means further counts the number of consecutive missing electronic components upon the supply tape and provides an alert signal to a system operator indicating the presence of a predetermined positive integral number M of vacancies upon the supply tape, where $M>N$.

14. The system of claim 1 further including third control means for positioning a circuit board adjacent to said pick-up point, wherein said third control means is coupled to said first control means for providing a second detection signal thereto indicating that all N components from the first component group are positioned upon a first circuit board before the component supply tape is rapidly advanced to the second component group.

15. A method for positioning first electronic components upon a first circuit board and second electronic components upon a second circuit board, wherein said first and second electronic components are provided in spaced relation upon a supply tape and are arranged in respective first and second separated groups thereon and wherein said first and second electronic components are positioned in combinations of N components upon said first and second circuit boards, respectively, where N is a positive integer greater than 1, said method comprising:

displacing said supply tape in a step-wise linear manner so as to sequentially position each of said electronic components at a pick-up point;

counting the number of first electronic components in the first group as they are displaced toward said pick-up point;

positioning said first electronic components upon said first circuit board if the number of said first electronic components is $\geq N$;

detecting the absence of a first electronic component from the first group;

rapidly displacing said supply tape to the second group of electronic components thereon without removing the remaining first electronic components in the first group if the remaining first electronic components in the first group is $<N$;

replacing said first circuit board with said second circuit board; and positioning N of said second electronic components from the second group upon said second circuit board.

16. The method of claim 15 wherein the steps of counting the number of said first electronic components in the first group and detecting the absence of a first electronic component from the first group comprises the steps of illuminating the moving supply tape with a light beam and detecting the transmission of said light beam through the supply tape indicating the absence of an electronic component or detecting the absence of said light beam indicating the presence of an electronic component.

17. The method of claim 15 further including the step of detecting the positioning of N of said first electronic components upon the first circuit board prior to rapidly displacing said supply tape to the second group of electronic components when the remaining first electronic components thereon is <N.

18. The method of claim 15 further including the step of providing an alert signal when the number of consecutive missing first electronic components from the first group exceeds a predetermined positive integral number M, where M>N.

19. The method of claim 15 further including the step of providing N+1 of said first electronic components between said pick-up point and a location whereat the presence or absence of said first electronic components is detected.

* * * * *